(12) United States Patent
Lim et al.

(10) Patent No.: US 11,569,306 B2
(45) Date of Patent: *Jan. 31, 2023

(54) DISPLAY APPARATUS AND METHOD OF MANUFACTURING THE SAME

(71) Applicant: Samsung Display Co., LTD., Yongin-si (KR)

(72) Inventors: Sanghyung Lim, Yongin-si (KR); Soonmi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 149 days.

This patent is subject to a terminal disclaimer.

(21) Appl. No.: 17/005,210

(22) Filed: Aug. 27, 2020

(65) Prior Publication Data

US 2021/0288117 A1    Sep. 16, 2021

(30) Foreign Application Priority Data

Mar. 12, 2020  (KR) ......................... 10-2020-0030758

(51) Int. Cl.
| | |
|---|---|
| *H01L 27/32* | (2006.01) |
| *H01L 51/56* | (2006.01) |
| *H01L 51/52* | (2006.01) |
| *H01L 51/50* | (2006.01) |

(52) U.S. Cl.
CPC .......... *H01L 27/322* (2013.01); *H01L 51/502* (2013.01); *H01L 51/5271* (2013.01); *H01L 51/56* (2013.01)

(58) Field of Classification Search
CPC ............. H01L 51/5237; H01L 51/5271; H01L 27/322
See application file for complete search history.

(56) References Cited

U.S. PATENT DOCUMENTS

| | | | |
|---|---|---|---|
| 6,630,274 B1 | 10/2003 | Kiguchi et al. | |
| 9,110,202 B2 | 8/2015 | Um | |
| 10,083,944 B2* | 9/2018 | Lee | .................. H01L 33/32 |
| 10,185,066 B2* | 1/2019 | Chae | ................ G02F 1/133514 |

(Continued)

FOREIGN PATENT DOCUMENTS

| | | | |
|---|---|---|---|
| JP | 2017-161604 | | 9/2017 |
| JP | 2017161604 A | * | 9/2017 |

(Continued)

*Primary Examiner* — Sophia T Nguyen
(74) *Attorney, Agent, or Firm* — H.C. Park & Associates, PLC

(57) ABSTRACT

A display apparatus includes a first substrate; a first light-emitting device, a second light-emitting device, and a third light-emitting device disposed over the first substrate, each of the first to third light-emitting devices including a first light emission layer; a second substrate disposed over the first substrate with the first to third light-emitting devices therebetween, the second substrate including a first through hole, a second through hole, and a third through hole overlapping the first to third light-emitting devices; a reflective layer on an inner surface of each of the first to third through holes; a first color filter layer in the first through hole; a second color filter layer and a second quantum dot layer in the second through hole; and a third color filter layer and a third quantum dot layer in the third through hole.

16 Claims, 11 Drawing Sheets

(56) References Cited

U.S. PATENT DOCUMENTS

| | | | |
|---|---|---|---|
| 10,228,586 B2 | 3/2019 | Chae et al. | |
| 10,678,091 B2* | 6/2020 | Lee | G02F 1/133514 |
| 10,739,502 B2* | 8/2020 | Baek | H01L 27/322 |
| 10,916,722 B2* | 2/2021 | Park | H01L 27/3211 |
| 11,004,910 B2* | 5/2021 | Jung | H01L 51/502 |
| 11,042,059 B2* | 6/2021 | Lee | H01L 51/5275 |
| 11,444,258 B2* | 9/2022 | Park | H01L 27/3206 |
| 2007/0200492 A1* | 8/2007 | Cok | H01L 51/5268 313/506 |
| 2008/0129189 A1* | 6/2008 | Cok | B82Y 20/00 313/506 |
| 2008/0246396 A1* | 10/2008 | Watanabe | C09K 11/7731 313/512 |
| 2010/0219429 A1* | 9/2010 | Cok | H01L 51/5284 257/89 |
| 2014/0353630 A1* | 12/2014 | Baek | H01L 27/3246 257/40 |
| 2016/0033823 A1* | 2/2016 | Lee | G02F 1/133617 349/71 |
| 2016/0041430 A1* | 2/2016 | Lee | G02F 1/133514 349/96 |
| 2017/0104182 A1* | 4/2017 | Kim | H01L 51/5271 |
| 2017/0125740 A1* | 5/2017 | Lee | H01L 51/5271 |
| 2017/0194387 A1* | 7/2017 | Oh | H01L 51/5221 |
| 2018/0006093 A1* | 1/2018 | Kim | H01L 33/06 |
| 2018/0019286 A1* | 1/2018 | Oh | H01L 51/5072 |
| 2018/0045866 A1* | 2/2018 | Chae | G02F 1/133514 |
| 2018/0047800 A1* | 2/2018 | Choi | H01L 51/5253 |
| 2018/0107028 A1* | 4/2018 | Jung | G02F 1/133707 |
| 2018/0151543 A1* | 5/2018 | Lee | H01L 23/5386 |
| 2018/0156951 A1* | 6/2018 | Baek | G02B 5/201 |
| 2018/0202616 A1* | 7/2018 | Yoon | F21K 9/64 |
| 2018/0211979 A1* | 7/2018 | Lee | H01L 27/322 |
| 2018/0219183 A1* | 8/2018 | Song | H01L 51/5275 |
| 2018/0224701 A1* | 8/2018 | Shin | G02F 1/133621 |
| 2018/0284613 A1* | 10/2018 | Hirayama | G03F 7/168 |
| 2018/0374409 A1* | 12/2018 | Lee | H01L 27/3244 |
| 2019/0018286 A1* | 1/2019 | Kim | G02F 1/133617 |
| 2019/0049779 A1* | 2/2019 | Lee | H01L 27/3218 |
| 2019/0072818 A1* | 3/2019 | Jung | G02F 1/133514 |
| 2019/0086740 A1* | 3/2019 | Bae | G02F 1/133345 |
| 2019/0094624 A1* | 3/2019 | Kim | G02F 1/133617 |
| 2019/0121176 A1* | 4/2019 | Lee | G02F 1/133617 |
| 2019/0155094 A1* | 5/2019 | Kim | G02F 1/133512 |
| 2019/0165318 A1* | 5/2019 | Choi | H01L 27/322 |
| 2019/0189876 A1 | 6/2019 | Lee et al. | |
| 2019/0221767 A1* | 7/2019 | Lee | H01L 31/02164 |
| 2020/0081173 A1* | 3/2020 | Tak | H01L 25/0753 |
| 2020/0081292 A1* | 3/2020 | Park | G02F 1/133617 |
| 2020/0091464 A1* | 3/2020 | Park | H01L 27/3206 |
| 2020/0135811 A1* | 4/2020 | Jung | H01L 51/0024 |
| 2020/0152919 A1* | 5/2020 | Joo | H01L 27/322 |
| 2020/0159065 A1* | 5/2020 | Kim | G02F 1/133512 |
| 2020/0168667 A1* | 5/2020 | Kim | H01L 51/56 |
| 2020/0168668 A1* | 5/2020 | Kim | H01L 51/5271 |
| 2020/0217998 A1* | 7/2020 | Jung | G02B 5/201 |
| 2020/0258946 A1* | 8/2020 | Kim | H01L 51/5253 |
| 2020/0273929 A1* | 8/2020 | Kim | H01L 51/525 |
| 2020/0292859 A1* | 9/2020 | Lee | H01L 51/5284 |
| 2020/0303676 A1* | 9/2020 | Lin | H01L 51/502 |
| 2020/0312916 A1* | 10/2020 | Kim | H01L 51/502 |
| 2020/0321400 A1* | 10/2020 | Park | H01L 27/322 |
| 2020/0326586 A1* | 10/2020 | Kim | G02F 1/13473 |
| 2020/0328256 A1* | 10/2020 | Lee | H01L 51/502 |
| 2020/0335571 A1* | 10/2020 | Kim | H01L 51/5275 |
| 2020/0357853 A1* | 11/2020 | Yan | H01L 27/322 |
| 2020/0373359 A1* | 11/2020 | Lee | H01L 51/5284 |
| 2020/0388663 A1* | 12/2020 | Lee | H01L 51/5271 |
| 2021/0036062 A1* | 2/2021 | Kim | H01L 51/5284 |
| 2021/0183954 A1* | 6/2021 | Liang | H01L 27/322 |
| 2021/0273022 A1* | 9/2021 | Park | G02B 5/201 |
| 2021/0288117 A1* | 9/2021 | Lim | H01L 51/524 |
| 2021/0296604 A1* | 9/2021 | Lim | H01L 27/322 |
| 2021/0376021 A1* | 12/2021 | Joo | H01L 27/3246 |
| 2021/0408130 A1* | 12/2021 | Pan | H01L 27/322 |
| 2022/0057673 A1* | 2/2022 | Jung | H01L 27/3244 |
| 2022/0093691 A1* | 3/2022 | Kim | H01L 51/502 |
| 2022/0123247 A1* | 4/2022 | Tak | H01L 51/5036 |
| 2022/0238606 A1* | 7/2022 | Jeong | H01L 51/5284 |
| 2022/0285447 A1* | 9/2022 | Park | H01L 51/5268 |

FOREIGN PATENT DOCUMENTS

| | | |
|---|---|---|
| KR | 10-1154368 | 6/2012 |
| KR | 10-2018-0035286 | 4/2018 |
| KR | 10-2019-0071152 | 6/2019 |

* cited by examiner

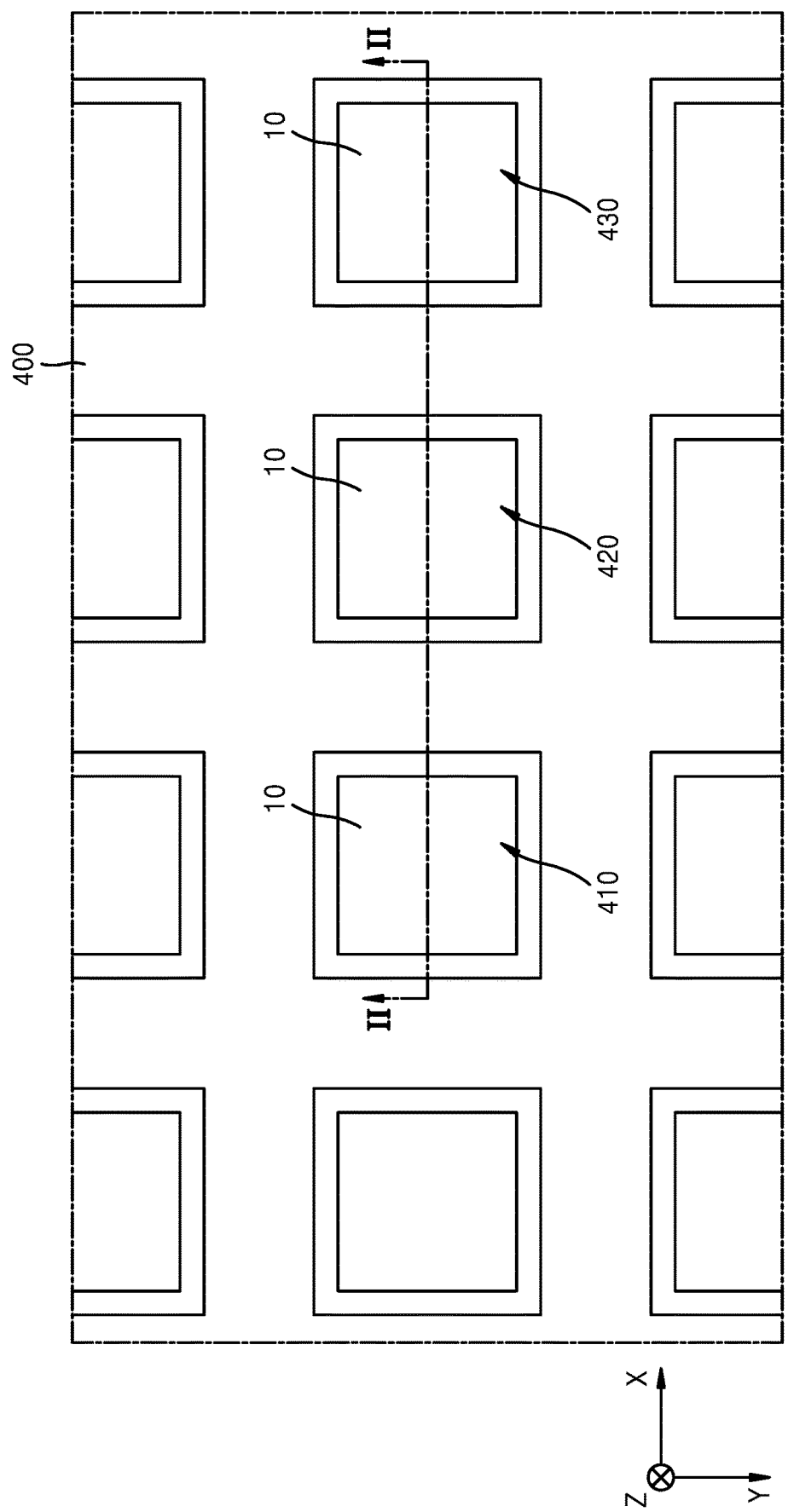

DISPLAY APPARATUS AND METHOD OF MANUFACTURING THE SAME

CROSS-REFERENCE TO RELATED APPLICATION

This application claims priority from and the benefit of Korean Patent Application No. 10-2020-0030758, filed on Mar. 12, 2020, which is hereby incorporated by reference for all purposes as if fully set forth herein.

BACKGROUND

Field

Exemplary implementations of the invention relate generally to a display apparatus and a method of manufacturing the same, and more specifically, to a display apparatus and a method of manufacturing the same for reducing the defect ratio of the display apparatus and the amount of consumed material during manufacturing.

Discussion of the Background

A display apparatus includes a plurality of pixels. The plurality of pixels may emit different colors of light for implementing a full-color display apparatus. To this end, at least some pixels of the display apparatus each have a color conversion unit. Accordingly, first color light generated from a light-emitting portion of some pixels is converted into second color light while passing through a corresponding color conversion unit, and then the second color light is emitted to the outside.

The above information disclosed in this Background section is only for understanding of the background of the inventive concepts, and, therefore, it may contain information that does not constitute prior art.

SUMMARY

Applicant discovered that an excessive amount of a material for forming a color conversion unit of a display apparatus may be used and a high defect ratio of the display apparatus is caused during the manufacturing processes forming the color conversion unit.

Display apparatuses with color filters and color conversion units constructed according to the principles and exemplary implementations of the invention and methods of fabricating the same according to the principles of the invention are capable of guaranteeing a low defect ratio and reducing the amount of a material consumed during manufacturing processes. For example, these benefits may be achieved by forming the color filter and color conversion units in through holes of a separate upper substrate, which is subsequently joined to a lower substrate containing the display panel and light emitting elements.

Additional features of the inventive concepts will be set forth in the description which follows, and in part will be apparent from the description, or may be learned by practice of the inventive concepts.

According to an aspect of the invention, a display apparatus includes: a first substrate; a first light-emitting device, a second light-emitting device, and a third light-emitting device disposed over the first substrate, each of the first to third light-emitting devices including a first light emission layer; a second substrate disposed over the first substrate with the first to third light-emitting devices therebetween, the second substrate including a first through hole, a second through hole, and a third through hole overlapping the first to third light-emitting devices; a reflective layer on an inner surface of each of the first to third through holes; a first color filter layer in the first through hole; a second color filter layer and a second quantum dot layer in the second through hole; and a third color filter layer and a third quantum dot layer in the third through hole.

The first to third light-emitting devices may include a first pixel electrode, a second pixel electrode, and a third pixel electrode; and an opposite electrode overlapping the first to third pixel electrodes, wherein the first light emission layer may be disposed over the first to third pixel electrodes and interposed between the first to third pixel electrodes and the opposite electrode.

The first light emission layer may be configured to emit light in a first wavelength band, the second quantum dot layer may be configured to convert the light in the first wavelength band into light in a second wavelength band, and the third quantum dot layer may be configured to convert the light in the first wavelength band into light in a third wavelength band.

The reflective layer may cover a portion of a first surface of the second substrate outside the first to third through holes, the first surface of the second substrate facing the first substrate.

The second quantum dot layer may be between the second color filter layer and the second light-emitting device, and the third quantum dot layer may be between the third color filter layer and the third light-emitting device.

The first substrate may be a lower substrate, the second substrate may be an upper substrate, and an upper surface of the first color filter layer, an upper surface of the second color filter layer, and an upper surface of the third color filter layer, may form a substantially continuous surface with an upper surface of the upper substrate, the upper surface of the upper substrate opposite to the lower substrate.

The display apparatus may include a first protective layer between the second color filter layer and the second quantum dot layer and between the third color filter layer and the third quantum dot layer.

The first protective layer may be integrally formed as a single body over an entire surface of the second substrate.

The display apparatus may include a light transmission layer in the first through hole interposed between the first color filter layer and the first light-emitting device.

The first protective layer may be between the first color filter layer and the light transmission layer.

The display apparatus may include a second protective layer between the second quantum dot layer and the second light-emitting device and between the third quantum dot layer and the third light-emitting device.

The second protective layer may be integrally formed as a single body over substantially an entire surface of the second substrate.

The second protective layer may be in contact with the first protective layer on a portion of a lower surface of the second substrate outside the first to third through holes, the lower surface facing the first substrate.

The inner surface of each of the first to third through holes may be inclined with respect to a first surface of the second substrate, the first surface facing the first substrate.

A first cross-sectional area of each of the first to third through holes taken along a first plane substantially parallel to a first surface of the second substrate may be smaller than a second cross-sectional area of each of the first to third through holes taken along a second plane substantially parallel to the first surface of the second substrate, the second plane being closer to the first substrate than the first plane, the first surface facing the first substrate.

The second substrate may include an opaque material.

The second substrate may include a black pigment.

The second substrate may be opaque.

According to another aspect of the invention, a method of manufacturing a display apparatus includes the steps: forming a layer of a first substrate on a carrier substrate; forming the first substrate by forming a first through hole, a second through hole, and a third through hole in the layer of the first substrate; forming a reflective layer on the first substrate; removing the reflective layer on the carrier substrate in the first to third through holes; forming a first color filter layer in the first through hole; forming a second color filter layer in the second through hole; forming a third color filter layer in the third through hole; forming a first quantum dot layer on the second color filter layer in the second through hole; and forming a second quantum dot layer on the third color filter layer in the third through hole.

The method may further include the steps of: forming a first light-emitting device, a second light-emitting device, and a third light-emitting device over a second substrate, the first to third light-emitting devices including a first light emission layer; and aligning and bonding the first substrate and the second substrate to each other with the first to third light-emitting devices therebetween, wherein the first to third through holes may overlap the first to third light-emitting devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 2A to 9 are cross-sectional views or plan views illustrating processes of manufacturing the display apparatus of FIG. 1.

DETAILED DESCRIPTION

Figure 1:
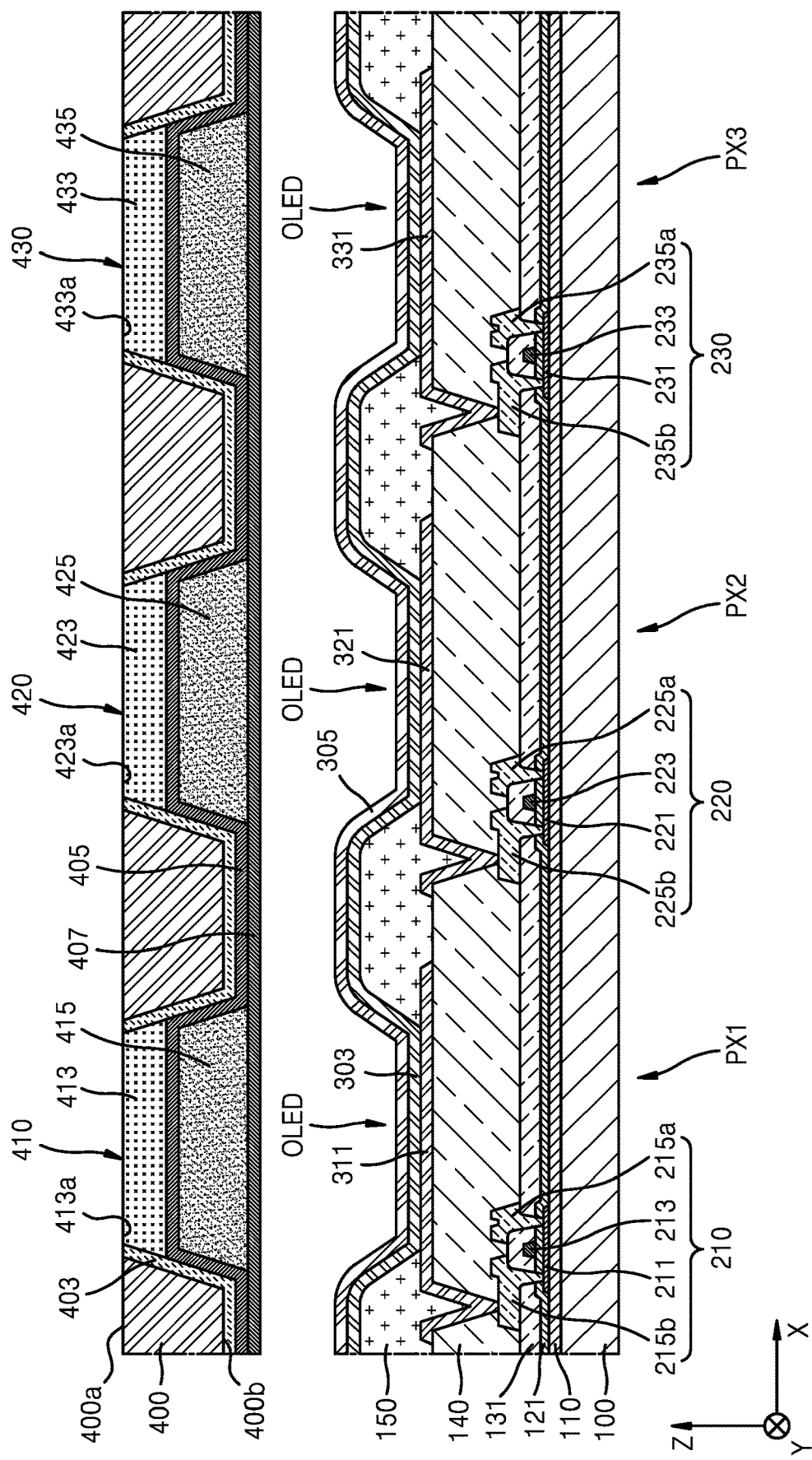
FIG. 1 is a cross-sectional view of an exemplary embodiment of a display apparatus constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of an exemplary embodiment of a display apparatus constructed according to the principles of the invention. As shown in FIG. 1, the display apparatus includes first to third pixels PX1 to PX3. However, the display apparatus may include more pixels. In FIG. 1, the first to third pixels PX1 to PX3 are adjacent to one another, but one or more exemplary embodiments are not limited thereto. For example, other elements such as wirings may be among the first to third pixels PX1 to PX3. Accordingly, the first and second pixels PX1 and PX2, for example, may not be adjacent to each other. Also, in FIG. 1, cross-sections of the first to third pixels PX1 to PX3 may not be taken along the same direction.

The display apparatus includes a lower substrate 100. The lower substrate 100 may include glass, metal, a polymer resin, or the like. When the lower substrate 100 is flexible or bendable, the lower substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate. The lower substrate 100 may be variously modified, for example, the lower substrate 100 may have a multi-layered structure including at least two layers and a barrier layer between the at least two layers. Each of the at least two layers may include a polymer resin, and the barrier layer may include an inorganic material such as silicon oxide, silicon nitride, silicon oxynitride, or the like.

A first pixel electrode 311, a second pixel electrode 321, and a third pixel electrode 331 are disposed on the lower substrate 100. For example, a plurality of display devices is disposed on the lower substrate 100. In addition to the display devices, first to third thin film transistors 210, 220, and 230 electrically connected to the display devices may be on the lower substrate 100. In FIG. 1, the display devices are in the form of organic light-emitting devices disposed on the lower substrate 100 but any type of light-emitting devices suitable for use as display devices in a display panel may be employed in exemplary embodiments of the invention. The organic light-emitting devices are electrically connected to the first to third thin film transistors 210, 220, and 230 through the first to third pixel electrodes 311, 321, and 331.

In FIG. 1, the first thin film transistor 210 is in the first pixel PX1, the second thin film transistor 220 is in the second pixel PX2, and the third thin film transistor 230 is in the third pixel PX3. In addition, the first to third thin film transistors 210 to 230 are respectively connected to the pixel electrodes of the display devices in the corresponding pixels. Hereinafter, the first thin film transistor 210 and the display device connected to the first thin film transistor 210 will be described for convenience of description, and the description may be also applied to the second and third thin film transistors 220 and 230 and the display devices connected to the second and third thin film transistors 220 and 230. That is, descriptions of a second semiconductor layer 221, a second gate electrode 223, a second source electrode 225a, and a second drain electrode 225b of the second thin film transistor 220, and the second pixel electrode 321 are omitted to avoid redundancy. Likewise, descriptions of a third semiconductor layer 231, a third gate electrode 233, a third source electrode 235a, and a third drain electrode 235b of the third thin film transistor 230, and the third pixel electrode 331 are omitted to avoid redundancy.

The first thin film transistor 210 may include a first semiconductor layer 211, a first gate electrode 213, a first source electrode 215a, and a first drain electrode 215b, wherein the first semiconductor layer 211 may include amorphous silicon, polycrystalline silicon, an organic semiconductor material, or an oxide semiconductor material. The first gate electrode 213 may have various layered structures including various conductive materials, which are formed of, e.g., a Mo layer and an Al layer. Alternatively, the first gate electrode 213 may include a TiNx layer, an Al layer, and/or a Ti layer. The first source electrode 215a and the first drain electrode 215b may also have various layered structures including various conductive materials, which are formed of, e.g., a Ti layer, an Al layer, and/or a Cu layer.

In order to ensure an insulating property between the first semiconductor layer 211 and the first gate electrode 213, a first gate insulating layer 121 including an inorganic material such as silicon oxide, silicon nitride, and/or silicon oxynitride may be between the first semiconductor layer 211 and the first gate electrode 213. In addition, a first interlayer insulating layer 131 including an inorganic material such as silicon oxide, silicon nitride, and/or silicon oxynitride may be on the first gate electrode 213. The first source electrode 215a and the first drain electrode 215b may be on the first interlayer insulating layer 131. The insulating layer including the inorganic material may be formed through a chemical vapor deposition (CVD) or an atomic layer deposition (ALD) method. This will be also applied to exemplary embodiments and modifications thereof that will be described later.

A buffer layer 110 may be disposed between the first thin film transistor 210 and the lower substrate 100. The buffer layer 110 may include an inorganic material such as silicon oxide, silicon nitride, and/or silicon oxynitride. The buffer layer 110 may improve the smoothness of an upper surface of the lower substrate 100, or may prevent or reduce infiltration of impurities into the first semiconductor layer 211 of the first thin film transistor 210 from the lower substrate 100.

In addition, a planarization layer 140 may be on the first thin film transistor 210. For example, when an organic light-emitting device is on the first thin film transistor 210 as shown in FIG. 1, the planarization layer 140 may planarize an upper portion of a protective layer covering the first thin film transistor 210. The planarization layer 140 may include, for example, an organic material such as acryl, benzocyclobutene (BCB), hexamethyldisiloxane (HMDSO), etc. In FIG. 1, the planarization layer 140 has a single-layered structure, but may be variously modified. For example, the planarization layer 140 may have a multi-layered structure.

A display device may be disposed on the planarization layer 140 of the lower substrate 100. The organic light-emitting device as shown in FIG. 1 may be used as the display device. In the first pixel PX1, the organic light-emitting device may include, for example, the first pixel electrode 311, an opposite electrode 305, and an intermediate layer 303 between the first pixel electrode 311 and the opposite electrode 305. For example, the intermediate layer 303 includes an emission layer. The first pixel electrode 311 is electrically connected to the first thin film transistor 210 by contacting one of the first source electrode 215a and the first drain electrode 215b via an opening formed in the planarization layer 140, as shown in FIG. 1. The second pixel PX2 includes the second pixel electrode 321, and the third pixel PX3 includes the third pixel electrode 331. Each of the first to third pixel electrodes 311 to 331 includes a light transmission conductive layer including a conductive oxide material such as ITO, $In_2O_3$, IZO, etc., and a reflective layer including metal such as Al, Ag, etc. For example, the first to third pixel electrodes 311 to 331 may each have a triple-layered structure including ITO/Ag/ITO.

The intermediate layer 303 including the emission layer may be integrally formed as a single body over the first to third pixel electrodes 311 to 331, and the opposite electrode 305 on the intermediate layer 303 may be integrally formed as a single body over the first to third pixel electrodes 311 to 331. The opposite electrode 305 may include a light transmission conductive layer including ITO, $In_2O_3$, IZO, etc., and may include a semi-transmissive layer including metal such as Al, Ag, etc. For example, the opposite electrode 305 may include a semi-transmissive layer including Mg, Ag, etc.

A pixel defining layer 150 may be on the planarization layer 140. The pixel defining layer 150 includes an opening corresponding to each of the pixels, e.g., an opening exposing at least a central portion of each of the first to third pixel electrodes 311 to 331, and thus, defines the pixels. Also, in the example of FIG. 1, the pixel defining layer 150 increases the distance between an edge of each of the first to third pixel electrodes 311 to 331, and the opposite electrode 305, in order to prevent generation of an arc at the edge of the first to third pixel electrodes 311 to 331. The pixel defining layer 150 may include, for example, an organic material such as polyimide, hexamethyldisiloxane (HMDSO), etc.

The intermediate layer 303 may include a low-molecular weight organic material or a polymer material. When the intermediate layer 303 includes a low-molecular weight material, the intermediate layer 303 may include a hole injection layer (HIL), a hole transport layer (HTL), an emission layer (EML), an electron transport layer (ETL), and an electron injection layer (EIL) in a single or multiple-layered structure and may be obtained by a vacuum deposition method. When the intermediate layer 303 includes a polymer material, the intermediate layer 303 may include an HTL and an EML. Here, the HTL may include PEDOT, and the EML may include a poly-phenylenevinylene (PPV)-based or polyfluorene-based polymer material. The intermediate layer 303 may be arranged by a screen printing method, an inkjet printing method, a deposition method, a laser induced thermal imaging (LITI) method, etc. However, the intermediate layer 303 is not limited thereto, but may have various structures.

The intermediate layer 303 may include a layer integrally formed as a single body over the first to third pixel electrodes 311 to 331 as described above, but alternatively, the intermediate layer 303 may include a layer patterned to correspond to each of the first to third pixel electrodes 311 to 331. In either case, the intermediate layer 303 may include a first light emission layer. The first light emission layer may be integrally formed as a single body over the first to third pixel electrodes 311 to 331, but alternatively, may be patterned to correspond to each of the first to third pixel electrodes 311 to 331. The first light emission layer may emit light in a first wavelength band, e.g., light in a wavelength band from about 450 nm to about 495 nm.

The opposite electrode 305 is on the intermediate layer 303 to correspond to the first to third pixel electrodes 311 to 331. The opposite electrode 305 may be integrally formed as a single body over a plurality of organic light-emitting devices.

As the organic light-emitting device may be easily damaged due to external moisture or oxygen, an encapsulation layer may cover the organic light-emitting device to protect the organic light-emitting device. The encapsulation layer may include a first inorganic encapsulation layer, an organic encapsulation layer, and a second inorganic encapsulation layer.

An upper substrate 400 is disposed above the lower substrate 100, and the opposite electrode 305 may be between the upper substrate 400 and the lower substrate 100. The upper substrate 400 may include a polymer resin. The upper substrate 400 may include, for example, a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, etc. The upper substrate 400 may be variously modified. For example, the upper substrate 400 may have a multi-layered structure including at least two layers and a barrier layer between the at least two layers. The at least two layers may include the polymer resin. The barrier layer may include an inorganic material such as silicon oxide, silicon nitride, silicon oxynitride, etc. between the two layers. The upper substrate 400 may be flexible or bendable.

The upper substrate 400 may include first to third through holes 410, 420, and 430 respectively corresponding to the first to third pixel electrodes 311 to 331. That the first to third through holes 410 to 430 correspond to the first to third pixel electrodes 311 to 331 denotes that the first through hole 410 overlaps the first pixel electrode 311, the second through hole 420 overlaps the second pixel electrode 321, and the third through hole 430 overlaps the third pixel electrode 331, respectively, when viewed from a direction perpendicular to the upper substrate 400 (Z-axis direction).

An inner surface in each of the first to third through holes 410 to 430 of the upper substrate 400 is inclined with respect to a lower surface 400b of the upper substrate 400. The cross-sectional area of each of the first to third through holes 410 to 430 is defined as a cross-sectional area taken along a virtual plane (XY plane) substantially parallel to the lower surface 400b of the upper substrate 400. The cross-sectional area of each of the first through hole 410 to the third through hole 430 decreases in a direction from the lower surface 400b to an upper surface 400a of the upper substrate 400. For example, a first cross-sectional area of each of the first through hole 410 to the third through hole 430 taken along a first virtual plane substantially parallel to the lower surface 400b of the upper substrate 400 is smaller than a second cross-sectional area of each of the first through hole 410 to the third through hole 430 taken along a second virtual plane substantially parallel to the lower surface 400b of the upper substrate 400 when the second virtual plane is closer to the lower surface 400b of the upper substrate 400 than the first virtual plane.

A reflective layer 403 is in each of the first to third through holes 410 to 430. In detail, the reflective layer 403 is on the inner surface in each of the first to third through holes 410 to 430. The reflective layer 403 may include metal having reflectivity such as Al, Ag, etc. The reflective layer 403 may not be only located in the first to third through holes 410 to 430, but also may be on the lower surface 400b of the upper substrate 400, the lower surface 400b facing the lower substrate 100, as shown in FIG. 1. In detail, the reflective layer 403 may cover a portion of the lower surface 400b of the upper substrate 400 outside the first to third through holes 410 to 430.

A first color filter layer 413 is in the first through hole 410. In addition, a second color filter layer 423 and a second quantum dot layer 425 are in the second through hole 420, and a third color filter layer 433 and a third quantum dot layer 435 are in the third through hole 430.

The first color filter layer 413 may only transmit the light of a wavelength within a range from about 450 nm to about 495 nm, the second color filter layer 423 may only transmit the light of a wavelength within a range from about 495 nm to about 570 nm, and the third color filter layer 433 may only transmit the light of a wavelength within a range from about 630 nm to about 780 nm. The first to third color filter layers 413 to 433 may reduce external light reflection in the display apparatus.

For example, when the external light is incident on the first color filter layer 413, only the light of the predetermined wavelength as described above may pass through the first color filter layer 413 and the light of other wavelengths may be absorbed by the first color filter layer 413. Therefore, in the external light incident into the display apparatus, only the light of the predetermined wavelength as described above may pass through the first color filter layer 413, and some of the light passing through the first color filter layer 413 is reflected by the opposite electrode 305 or the first pixel electrode 311 under the first color filter layer 413 and emitted to the outside. Consequently, only some of the external light incident into the space where the first pixel PX1 is positioned may be reflected to the outside, and thus, the external light reflection may be reduced. The above description may be also applied to the second color filter layer 423 and the third color filter layer 433.

The second quantum dot layer 425 may convert light in the first wavelength band generated by the intermediate layer 303 on the second pixel electrode 321 into light in a second wavelength band. For example, when the intermediate layer 303 on the second pixel electrode 321 generates light of a wavelength within a range from about 450 nm to about 495 nm, the second quantum dot layer 425 may convert the light into the light of a wavelength within a range from about 495 nm to about 570 nm. Accordingly, the light of the wavelength within the range from about 495 nm to about 570 nm is emitted from the second pixel PX2 to the outside via the upper substrate 400.

The third quantum dot layer 435 may convert the light in the first wavelength band generated by the intermediate layer 303 on the third pixel electrode 331 into light in a third wavelength band. For example, when the light of a wavelength within the range from about 450 nm to about 495 nm is generated from the intermediate layer 303 of the third pixel electrode 331, the third quantum dot layer 435 may convert the light into the light having a wavelength within the range from about 630 nm to about 780 nm. Accordingly, the light of the wavelength within the range from about 630 nm to about 780 nm is emitted from the third pixel PX3 to the outside via the upper substrate 400.

Each of the second quantum dot layer 425 and the third quantum dot layer 435 may have a structure, in which quantum dots are dispersed in a resin. The quantum dots may include a semiconductor material such as cadmium sulfide (CdS), cadmium telluride (CdTe), zinc sulfide (ZnS), indium phosphide (InP), etc. Each of the quantum dots may have a size of several nanometers, and the wavelength of the light after conversion may vary depending on the size of each of the quantum dots. The second quantum dot layer 425 and the third quantum dot layer 435 may include any type of resin capable of light transmittance. For example, a polymer resin such as acryl, benzocyclobutene (BCB), or hexamethyldisiloxane (HMDSO) may be used as a material for forming the second quantum dot layer 425 and the third quantum dot layer 435.

The first pixel PX1 emits the light of a first wavelength generated by the intermediate layer 303 to the outside without converting the wavelength. Therefore, the first pixel PX1 does not include a quantum dot layer. As described above, because the quantum dot layer is not necessary in the first through hole 410, a light transmission layer (i.e., a transparent layer) 415 including a light-transmitting resin is disposed in the first through hole 410. The light transmission layer 415 may include acryl, benzocyclobutene (BCB), or hexamethyldisilioxane (HMDSO). Alternatively, the light transmission layer 415 may not be in the first through hole 410 unlike in the illustrated embodiment of FIG. 1.

In the illustrated display apparatus, the light in first wavelength band is emitted to the outside from the first pixel PX1, the light in the second wavelength band is emitted to the outside from the second pixel PX2, and the light in the third wavelength band is emitted to the outside from the third pixel PX3. Therefore, the display apparatus may display full-color images.

During the manufacturing processes, the first to third through holes 410 to 430 are provided on the upper substrate 400, and then, the first to third color filter layers 413 to 433 are positioned in the first to third through holes 410 to 430. Therefore, mixing of the materials used during the processes of forming the first to third color filter layers 413 to 433 may be effectively prevented. For example, when the first color filter layer 413 is formed and the second color filter layer 423 is formed, the material used to form the first color filter layer 413 and the material used to form the second color filter layer 423 may be mixed on the substrate in the display apparatus according to the related art. However, in the display apparatus according to the illustrated exemplary embodiment, the first to third color filter layers 413 to 433 are in the first to third through holes 410 to 430, and thus, mixing of the materials for forming the first to third color filter layers 413 to 433 may be prevented effectively.

In the display apparatus according to the related art, forming of a barrier layer on the substrate before forming the first and second color filter layers may be taken into account. The material for forming the first color filter layer and the material for forming the second color filter layer may not be mixed due to the barrier layer. However, in this case, in order to form the barrier layer to a sufficient height, a first barrier layer is formed and a second barrier layer has to be formed on the first barrier layer. Thus, processes may be complicated. In the display apparatus according to the illustrated exemplary embodiment, the process of forming the barrier layer during the manufacturing processes is obviated, and thus, the manufacturing processes may be simplified and a defect ratio may be decreased.

According to the display apparatus of the illustrated exemplary embodiment, the second quantum dot layer 425 and the third quantum dot layer 435 are in the second and third through holes 420 and 430 as described above. Therefore, the above descriptions about the first to third color filter layers 413 to 433 during the manufacturing processes may be also applied to the second and third quantum dot layers 425 and 435. That is, in the display apparatus according to the illustrated exemplary embodiment, mixing of the materials used to form the second quantum dot layer 425 and the third quantum dot layer 435 during the manufacturing processes may be effectively prevented.

As a reference, the second quantum dot layer 425 is between the second color filter layer 423 and the opposite electrode 305. Because the second color filter layer 423 transmits the light in the second wavelength band, the light in the first wavelength band generated by the intermediate layer 303 needs to be converted into the light in the second wavelength band by the second quantum dot layer 425 before being incident into the second color filter layer 423 that transmits the light in the second wavelength band. Likewise, the third quantum dot layer 435 is between the third color filter layer 433 and the opposite electrode 305. Accordingly, an upper surface 413a of the first color filter layer 413, which is opposite to the direction towards the lower substrate 100 (e.g., the negative Z axis direction), an upper surface 423a of the second color filter layer 423 in an opposite direction to the lower substrate 100 (e.g., the negative Z axis direction), and an upper surface 433a of the third color filter layer 433 in an opposite direction to the lower substrate 100 (e.g., the negative Z axis direction) may form continuous surfaces with the upper surface 400a of the upper substrate 400, which is opposite to the direction towards the lower substrate 100 (e.g., the negative Z axis direction). For example, the upper surface 413a of the first color filter layer 413, the upper surface 423a of the second color filter layer 423, the upper surface 433a of the third color filter layer 433, and the upper surface 400a of the upper substrate 400 may be substantially coplanar.

In addition, during the manufacturing processes or using the display apparatus after being manufactured, it may be necessary to prevent damage to the second and third quantum dot layers 425 and 435. For example, an outgas generated from the second color filter layer 423 may damage the quantum dots in the second quantum dot layer 425 so that the quantum dots may not convert the light in the first wavelength band into the light in the second wavelength band. Likewise, an outgas generated from the third color filter layer 433 damages the quantum dots in the third quantum dot layer 435 so that the quantum dots may not convert the light in the first wavelength band into the light in the third wavelength band. Thus, it may be necessary to prevent the damages of the second and third quantum dot layers 425 and 435 from the outgas. To this end, a first protective layer 405 may be disposed between the second color filter layer 423 and the second quantum dot layer 425, and between the third color filter layer 433 and the third quantum dot layer 435. The first protective layer 405 may include an inorganic material such as silicon oxide, silicon nitride, or silicon oxynitride, such that the outgas may not pass through the first protective layer 405. The first protective layer 405 may be integrally formed as a single body over the entire surface of the upper substrate 400. Accordingly, the first protective layer 405 is between the first color filter layer 413 and the light transmission layer 415 in the first through hole 410 of the upper substrate 400.

The first protective layer 405 includes an inorganic material, and thus may have a shape corresponding to a lower portion thereof when being formed. Accordingly, as shown in FIG. 1, the first protective layer 405 is flat on a portion of the reflective layer 403 outside the first to third through holes 410 to 430 of the upper substrate 400, and is formed along the reflective layer 403 in the first to third through holes 410 to 430 to be in contact with the first to third color filter layers 413 to 433. Processes of forming the first protective layer 405 will be described later.

In addition, the intermediate layer 303 included in the organic light-emitting device is vulnerable to impurities such as external moisture or oxygen. Therefore, during the manufacturing or using the display apparatus after finishing the manufacturing, it is necessary to prevent outgas generated by the second and third quantum dot layers 425 and 435 from proceeding in a direction towards the intermediate layer 303. To this end, a second protective layer 407 may be between the second quantum dot layer 425 and the opposite electrode 305 and between the third quantum dot layer 435 and the opposite electrode 305. The second protective layer 407 may include an inorganic material such as silicon oxide, silicon nitride, or silicon oxynitride, such that the outgas may not pass through the second protective layer 407. The second protective layer 407 may be integrally formed as a single body over the entire surface of the upper substrate 400. Accordingly, the second protective layer 407 is in contact with the light transmission layer 415 in the first through hole 410 of the upper substrate 400, is in contact with the second quantum dot layer 425 in the second through hole 420, and is in contact with the third quantum dot layer 435 in the third through hole 430. In addition, the second protective layer 407 is in contact with the first protective layer 405 on the portions in the lower surface 400b of the upper substrate 400, the portions are outside the first through third through holes 410 to 430.

FIGS. 2A to 9 are cross-sectional views or plan views illustrating processes of manufacturing the display apparatus of FIG. 1. In detail, FIGS. 2A to 9 are cross-sectional views or plan views illustrating exemplary processes of manufacturing the upper substrate 400, the first to third color filter layers 413 to 433, the second quantum dot layer 425, the third quantum dot layer 435, the first protective layer 405, and the second protective layer 407 in the display apparatus of FIG. 1.

Figure 2A:
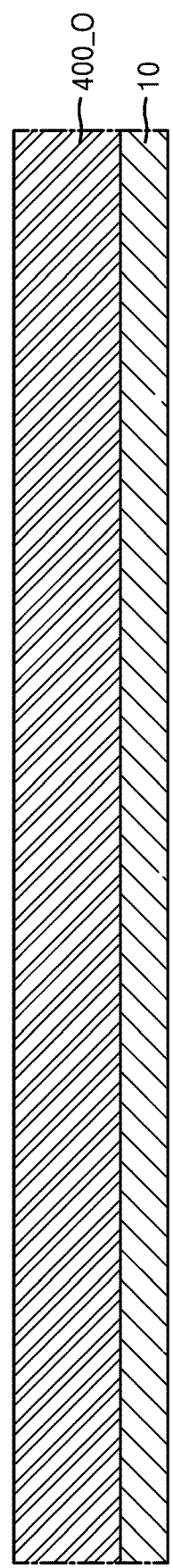
Figure 2B:
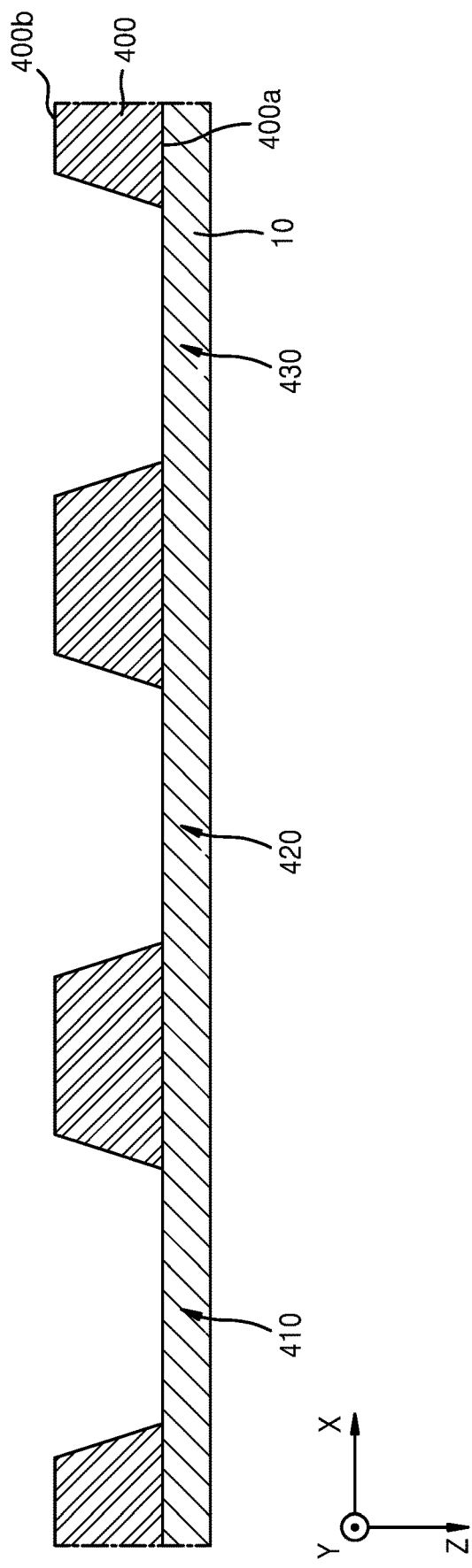

As shown in FIGS. 2B and 3, the upper substrate 400 including the first to third through holes 410 to 430 is prepared. Here, FIG. 2B shows a cross-section of the display apparatus taken along line II-II of FIG. 3 which is a plan view.

Referring to FIG. 2A, a layer 400_0 for forming the upper substrate 400 is prepared on a carrier substrate 10. Further, referring to FIG. 2B, the first to third through holes 410 to 430 are formed in the layer 400_0. For example, a material for forming polyimide is applied onto the carrier substrate 10 by a slit coating method, etc. to obtain the layer 400_0, and processes of exposing and developing certain portions by using a photomask are performed to form the first to third through holes 410 to 430 in the layer 400_0 on the carrier substrate 10. After that, the material for forming polyimide is cured through a UV exposure, a thermal treatment, etc. to obtain the upper substrate 400 including the first to third through holes 410 to 430 as shown in FIGS. 2B and 3. The carrier substrate 10 may include, for example, a glass substrate.

The upper substrate 400 may be variously modified. For example, the upper substrate 400 may include other polymer resins than the polyimide, and may have a multi-layered structure including at least two layers and a barrier layer between the at least two layers. The at least two layers may include a polymer resin. The barrier layer may include an inorganic material such as silicon oxide, silicon nitride, silicon oxynitride, etc.

When the material for forming the upper substrate 400 such as polyimide has the same properties as those of a photoresist, the material is applied onto the carrier substrate 10 to form the layer 400_0 as described above, and after that, the processes of exposing and developing certain portions by using a photomask are performed to form the first to third through holes 410 to 430 in the layer 400_0 on the carrier substrate 10. However, when the material for forming the upper substrate 400 does not have the same properties as those of the photoresist, a layer 400_0 is formed by using the material for forming the upper substrate 400 on the carrier substrate 10, and after that, the first to third through holes 410 to 430 may be formed in the layer 400_0 by a wet etching method using the photoresist.

As the first to third through holes 410 and 430 are obtained through the processes such as the exposure, the development, etc., in any of the cases in which the material for forming the upper substrate 400 has characteristics of the photoresist and in which additional photoresist is used, an inner surface of each of the first to third through holes 410 to 430 is inclined with respect to the lower surface 400b of the upper substrate 400. Accordingly, the reflective layer 403, which is to be formed later, may be arranged on the inner surface of each of the first to third through holes 410 to 430 without causing a defect. Here, a cross-sectional area of each of the first to third through holes 410 to 430 taken along a virtual plane (XY plane) that is in substantially parallel with the lower surface 400b of the upper substrate 400 is reduced as approached from the lower surface 400b towards an upper surface 400a of the upper substrate 400.

The upper substrate 400 may be formed by another method. For example, a layer 400_0 is formed on the carrier substrate 10 by using a material for forming the upper substrate 400. After that, a laser beam is radiated to a certain portion in the layer 400_0 to obtain the upper substrate 400 including the first to third through holes 410 to 430.

When the laser beam is radiated, the laser beam is not radiated to the layer 400_0 on the carrier substrate 10 by passing through the carrier substrate 10, but is directly radiated onto the layer 400_0 on the carrier substrate 10. With reference to a coordinate axis shown in FIG. 2B, the layer 400_0 for forming the upper substrate 400 is arranged on a surface of the carrier substrate 10, the surface is in the negative Z axis direction, and a laser beam is radiated in the positive Z axis direction from a laser beam source located in the negative Z axis direction with respect to the layer 400_0, and then, the laser beam may be directly radiated to the layer 400_0 on the carrier substrate 10. As such, as shown in FIGS. 2B and 3, an area of a cross-section in each of the first to third through holes 410 to 430, wherein the cross-section is taken along a virtual plane (XY plane) that is in substantially parallel with the lower surface 400b of the upper substrate 400, may be gradually reduced as approached from the lower surface 400b towards the upper surface 400a of the upper substrate 400.

Figure 4:
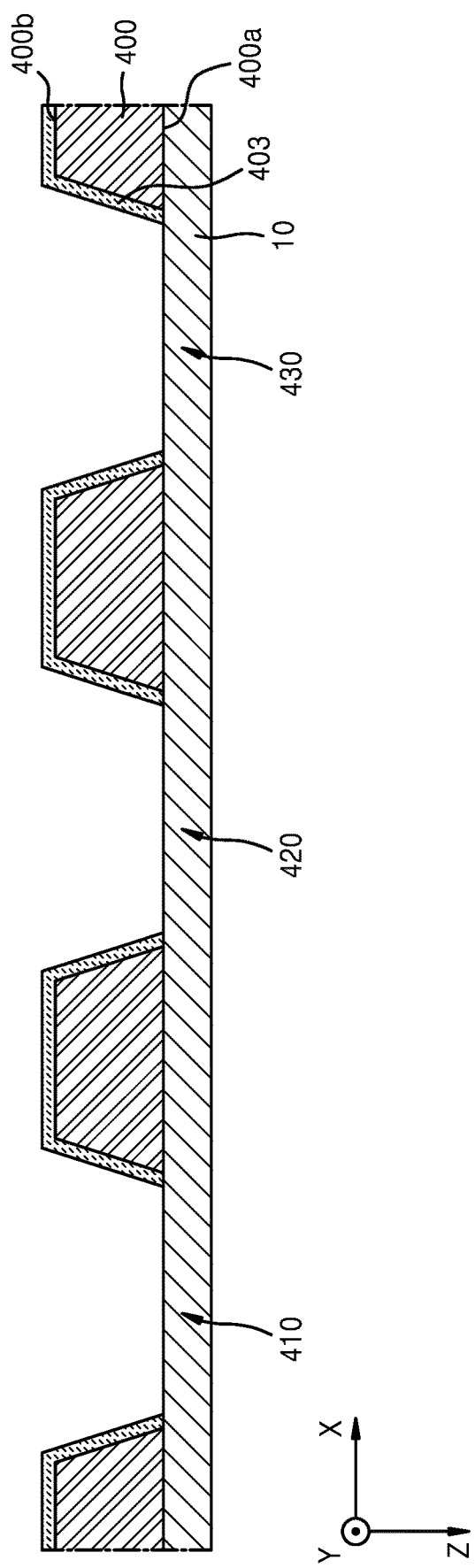

In addition, as shown in FIG. 4, the reflective layer 403 is formed on the inner surface in each of the first to third through holes 410 to 430 in the upper substrate 400. For example, a metal layer is entirely formed on the lower surface 400b of the upper substrate 400 by a sputtering method, etc. Here, the metal layer is also on the carrier substrate 10 in each of the first to third through holes 410 to 430. After that, the metal layer on the carrier substrate 10 in each of the first to third through holes 410 to 430 is removed to obtain the reflective layer 403 as shown in FIG. 4.

Removing of the metal layer on the carrier substrate 10 in each of the first to third through holes 410 to 430 may be performed by using a dry etching method using the photoresist. For example, the photoresist is arranged on the metal layer that is entirely on the lower surface 400b of the upper substrate 400, and then, exposure and developing processes are performed to remove only the photoresist on the metal layer on the carrier substrate 10 in each of the first to third through holes 410 to 430. After that, the metal layer on the carrier substrate 10 in each of the first to third through holes 410 and 430 may be removed by the dry etching method. Here, the photoresist remaining on the reflective layer 403 is also removed.

As described above, because the inner surface in each of the first to third through holes 410 to 430 is inclined with respect to the lower surface 400b of the upper substrate 400, the reflective layer 403 may be formed on the inner surface in each of the first to third through holes 410 to 430 of the upper substrate 400.

When the inner surface in each of the first to third through holes 410 to 430 is substantially perpendicular to the lower surface 400b of the upper substrate 400, a defect of not forming the metal layer on the inner surface in each of the first to third through holes 410 to 430 may occur when the metal layer is entirely formed on the lower surface 400b of the upper substrate 400.

Figure 5:
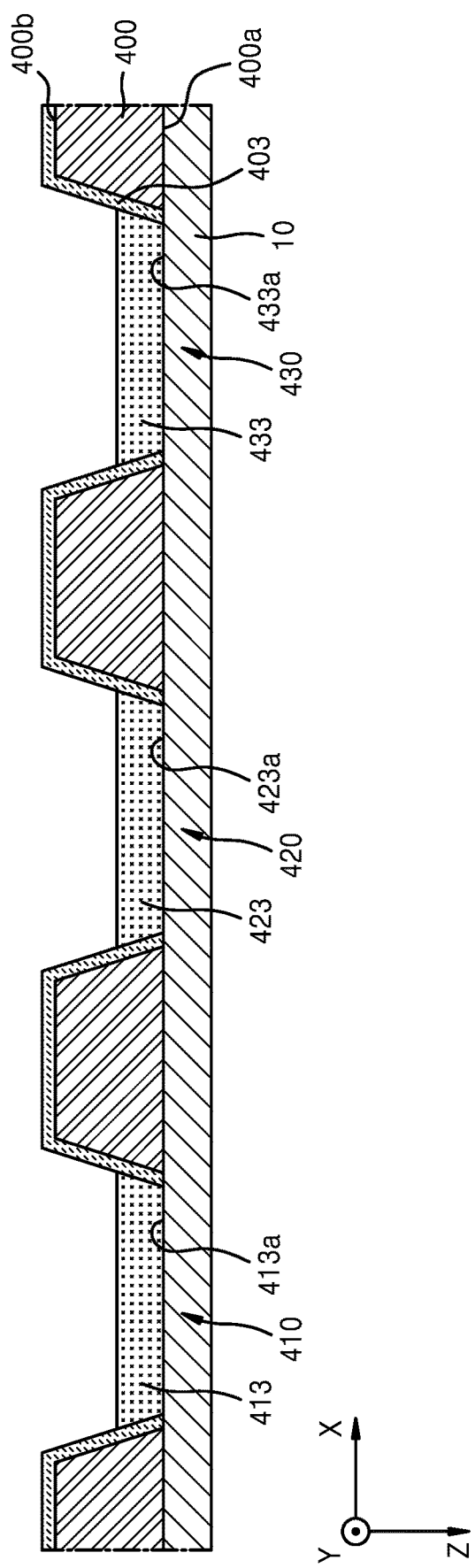

After that, as shown in FIG. 5, the first color filter layer 413 in the first through hole 410, the second color filter layer 423 in the second through hole 420, and the third color filter layer 433 in the third through hole 430 are formed by an inkjet printing method. As the color filter layers are formed by the inkjet printing method, the amount of waste material generated when forming the color filter layers may be reduced. Moreover, as the first to third color filter layers 413 to 433 are respectively in the first to third through holes 410 to 430, mixing of the materials that are used during the processes of forming the first to third color filter layers 413 to 433 may be effectively prevented.

Figure 6:
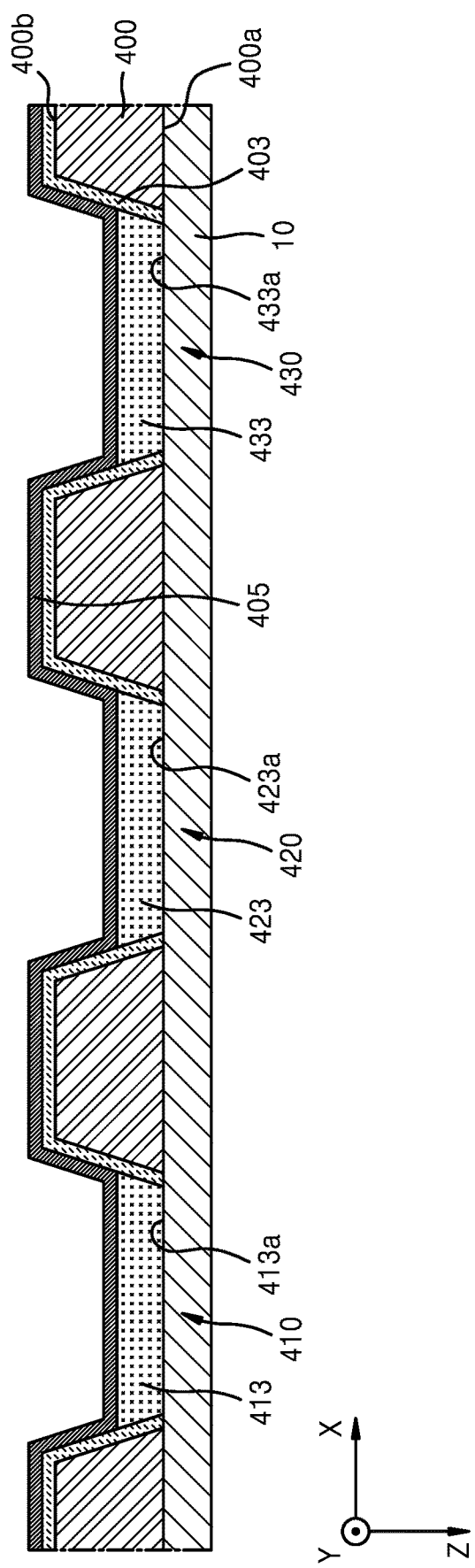

In addition, the first protective layer 405 is formed by using the silicon oxide, silicon nitride, or silicon oxynitride, so as to correspond to the entire lower surface 400b of the upper substrate 400, as shown in FIG. 6. Accordingly, the first protective layer 405 may be in contact with the reflective layer 403 on the inner surfaces of the first to third through holes 410 to 430, as well as the first to third color filter layers 413 to 433. Because the reflective layer 403 is also on the outer portions of the first to third through holes 410 to 430 in the lower surface 400b of the upper substrate 400, the first protective layer 405 is also in contact with the reflective layer 403 on the corresponding portions. The first protective layer 405 may be formed by a CVD method. Here, in order not to damage the first to third color filter layers 413 to 433 that are formed previously, a low temperature CVD method performed at the temperature of about 200° C. or less may be used.

Figure 7:
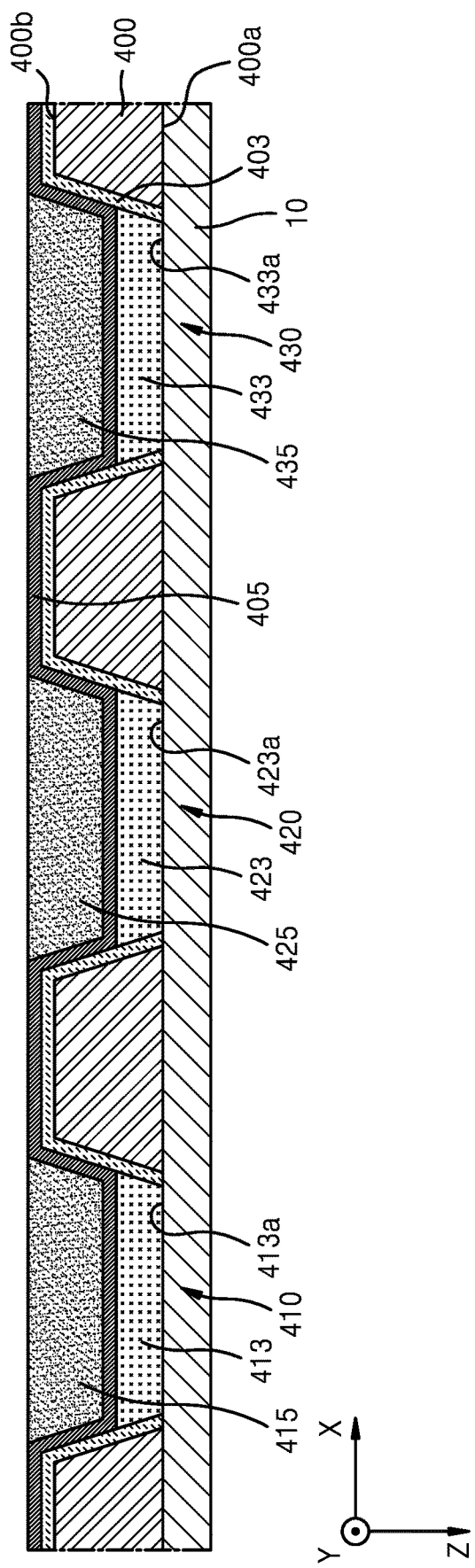

After forming the first protective layer 405, as shown in FIG. 7, the second quantum dot layer 425 and the third quantum dot layer 435 are formed in the second and third through holes 420 and 430. As the quantum dot layers are formed by the inkjet printing method, the amount of waste material generated when forming the quantum dot layers may be reduced. In addition, because the second and third quantum dot layers 425 and 435 are in the second and third through holes 420 and 430, mixing of the materials that are used in the processes of forming the second and third quantum dot layers 425 and 435 may be effectively prevented. The light transmission layer 415 may be formed on the first protective layer 405 in the first through hole 410, alternatively.

Figure 8:
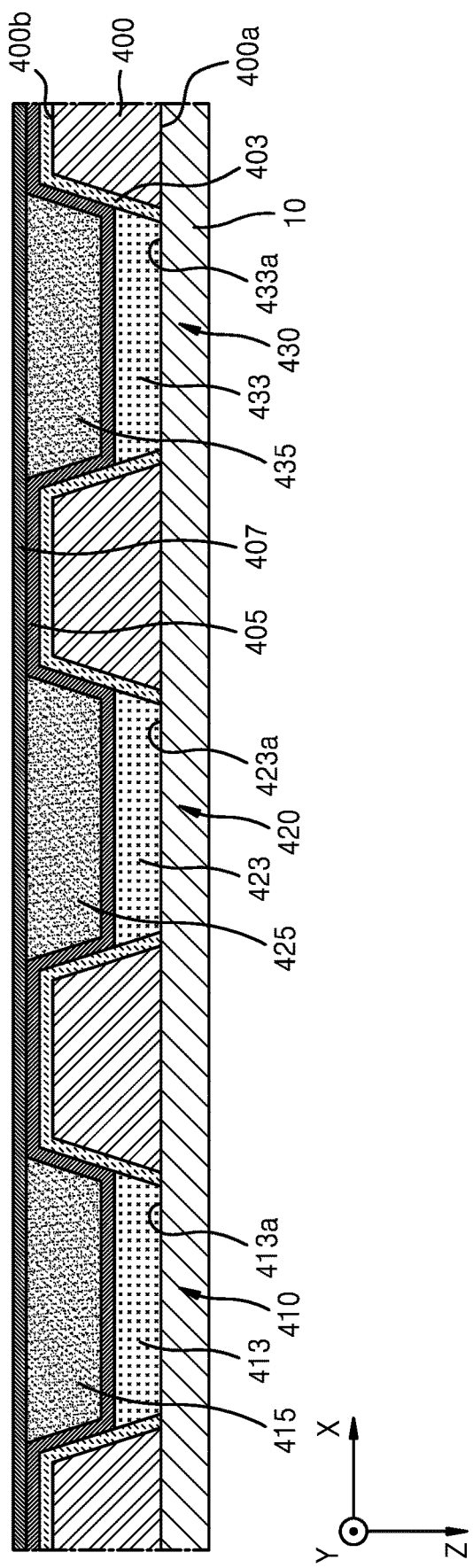

In addition, the second protective layer 407 is formed by using the silicon oxide, silicon nitride, or silicon oxynitride, so as to correspond to the entire lower surface 400b of the upper substrate 400, as shown in FIG. 8. Accordingly, the second protective layer 407 may be in contact with the first protective layer 405 on the outside of the first to third through holes 410 to 430, as well as the second and third quantum dot layers 425 and 435. The second protective layer 407 may be formed by the CVD method. Here, in order not to damage the first to third color filter layers 413 to 433 and/or the second and third quantum dot layers 425 and 435 that are formed previously, the low temperature CVD method executed at a temperature of about 200° C. or less may be used.

Figure 9:
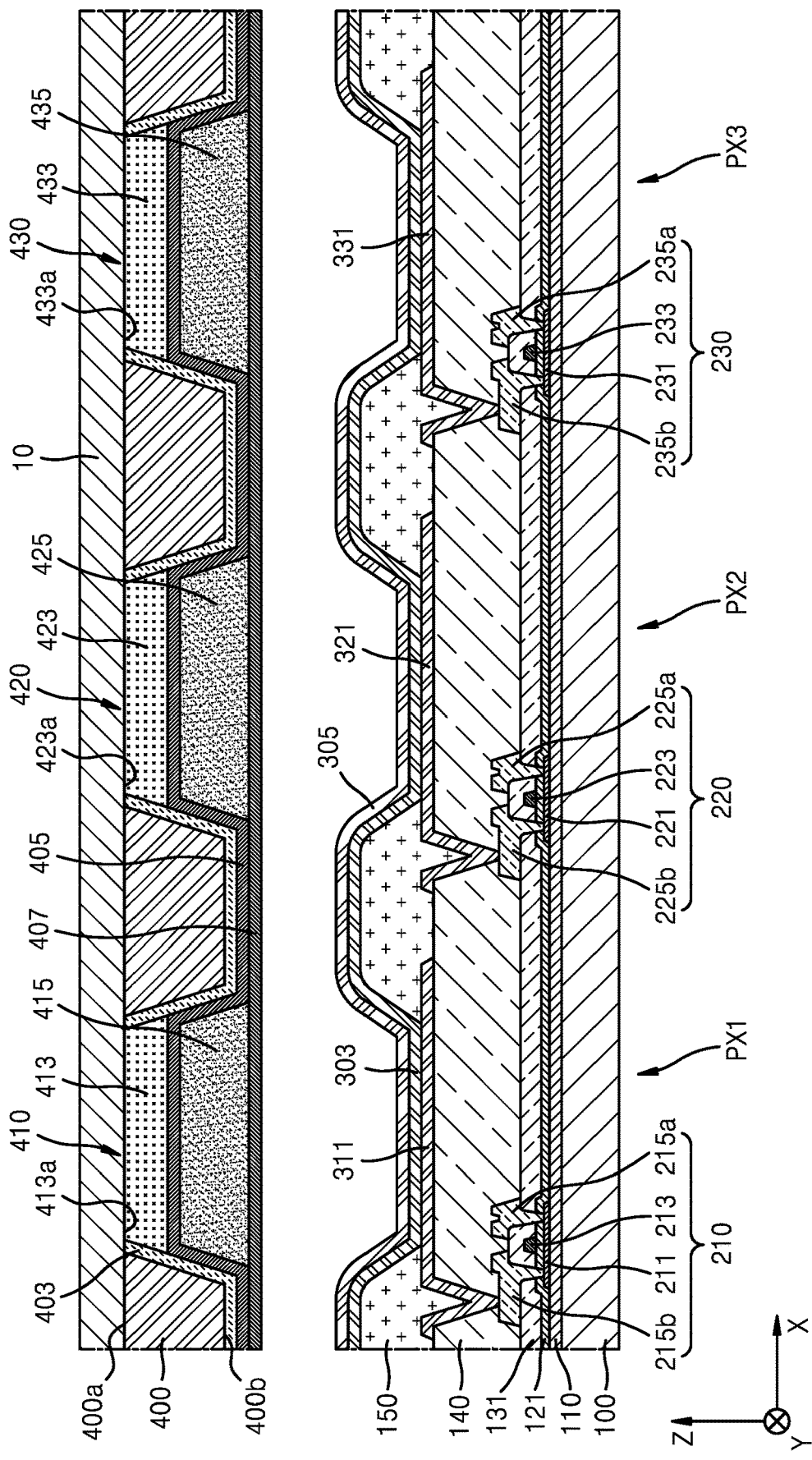

As described above, after forming the upper substrate 400, the first to third color filter layers 413 to 433, the second quantum dot layer 425, the third quantum dot layer 435, the first protective layer 405, and the second protective layer 407, the upper substrate 400 and the lower substrate 100 are bonded to each other as shown in FIG. 9. Before the above process, the first to third thin film transistors 210 to 230, the first to third pixel electrodes 311 to 331, the intermediate layer 303, and the opposite electrode 305 are formed on the lower substrate 100 through separate processes. In addition, after bonding the upper substrate 400 to the lower substrate 100, the carrier substrate 10 is removed from the upper substrate 400, and then, the display apparatus shown in FIG. 1 is manufactured. Alternatively, the carrier substrate 10 may be removed before bonding the upper substrate 400 and the lower substrate 100 to each other, and then, the upper substrate 400 and the lower substrate 100 are bonded to each other.

Bonding of the lower substrate 100 and the upper substrate 400 may be effected by a sealant applied to an outer portion of a display area to allow the lower substrate 100 and the upper substrate 400 to be bonded to each other. Alternatively, a filling material is located in a space between the lower substrate 100 and the upper substrate 400 as shown in FIGS. 1 and 9, and then, the lower substrate 100 and the upper substrate 400 are bonded to each other via the filling material. In this case, the filling material is a light-transmitting filling material including a light-transmissive polymer resin such as polyimide, epoxy, etc.

Figure 10:
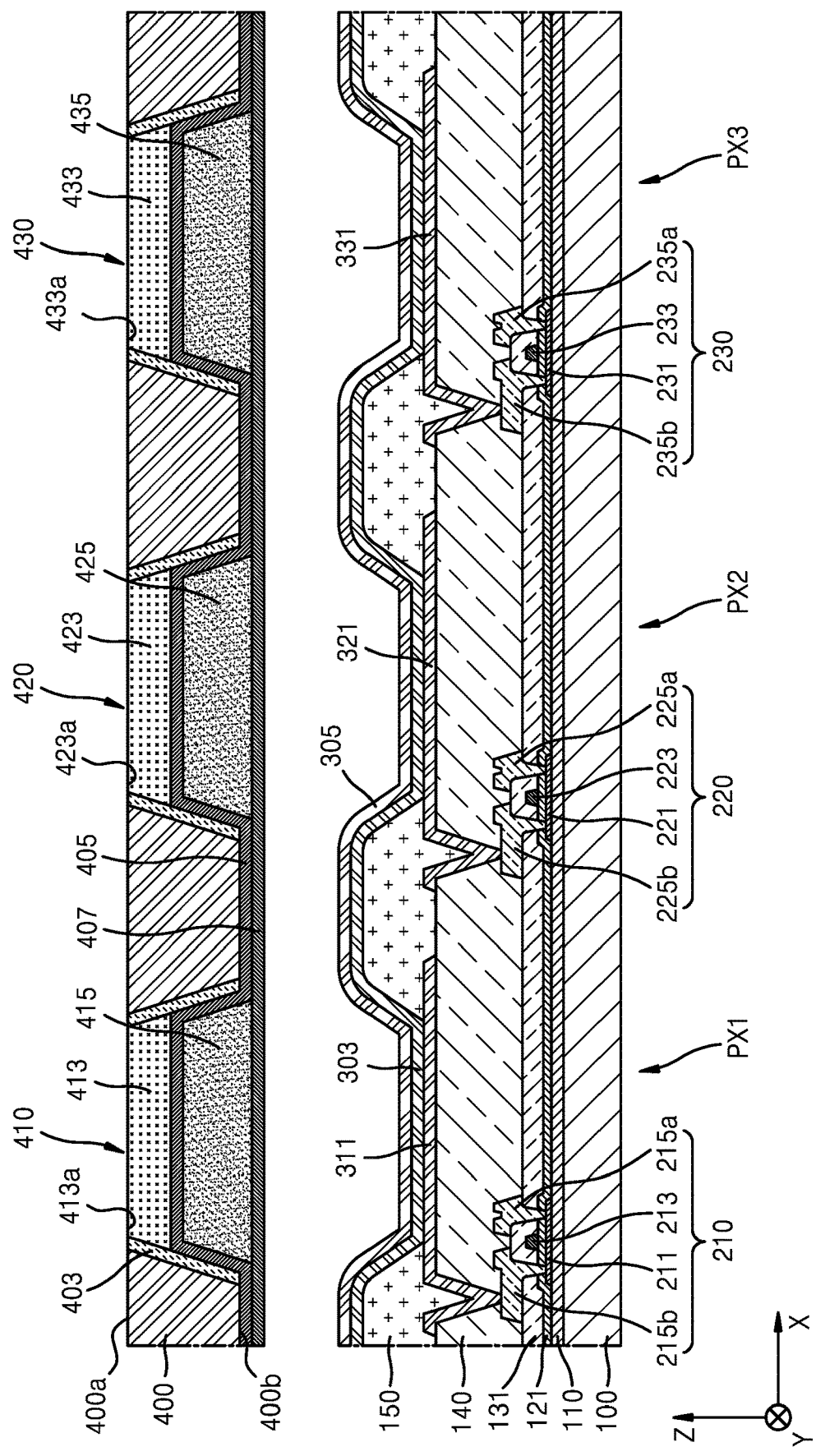
FIG. 10 is a cross-sectional view of another exemplary embodiment of the display apparatus constructed according to the principles of the invention.

In the above description, the reflective layer 403 is on the outer portions of the first to third through holes 410 to 430 on the lower surface 400b of the upper substrate 400, as well as on the inner surface in each of the first to third through holes 410 to 430 in the upper substrate 400. However, one or more exemplary embodiments are not limited thereto. For example, as shown in FIG. 10, which is a cross-sectional view of another exemplary embodiment of the display apparatus of FIG. 1, the reflective layer 403 may be only on the inner surface in each of the first to third through holes 410 to 430 in the upper substrate 400, and may not on the outer portions of the first to third through holes 410 to 430 on the lower surface 400b of the upper substrate 400. In this case, the first protective layer 405 is in contact with the lower surface 400b of the upper substrate 400 on the outer portions of the first to third through holes 410 to 430.

In addition, a surface of the second color filter layer 423 in the second through hole 420, the surface facing the second quantum dot layer 425, and a surface of the third color filter layer 433 in the third through hole 430, the surface facing the third quantum dot layer 435, may be substantially flat to be substantially parallel with the upper surface 400a of the upper substrate 400. This is because the second color filter layer 423 and the third color filter layer 433 are formed by the inkjet printing method, and thus the material for forming the second color filter layer 423 and the third color filter layer 433 is in a liquid state. The liquid is cured and/or baked during the manufacturing processes, the second and third color filter layers 423 and 433 are in solid state. Likewise, a surface of the first color filter layer 413, the surface facing the opposite electrode 305, is substantially flat to be substantially parallel with the upper surface 400a of the upper substrate 400.

The display apparatus having the organic light-emitting devices as display devices has been described, but the exemplary embodiments are not limited thereto. For example, in the structure shown in FIG. 1, the display devices connected to the first to third thin film transistors 210, 220, and 230 may not include the organic light-emitting devices, but other light emitting devices. For example, instead of the first to third pixel electrodes 311, 321, and 331, the intermediate layer 303, and the opposite electrode 305, a first light-emitting device may be connected to the first thin film transistor 210, a second light-emitting device may be connected to the second thin film transistor 220, and a third light-emitting device may be connected to the third thin film transistor 230. Each of the first to third light-emitting devices may include a first light emission layer. The first light emission layer may emit light in the first wavelength band, e.g., light of a wavelength within the range from about 450 nm to about 495 nm.

In the display apparatus according to the above-described exemplary embodiment the first to third light-emitting devices in the display apparatus include the first to third pixel electrodes 311 to 331, the opposite electrode 305 corresponding to the first to third pixel electrodes 311 to 331, and the first light emission layers in the first to third light-emitting devices are disposed on the first to third pixel electrodes 311 to 331 to be between the first to third pixel electrodes 311 to 331 and the opposite electrode 305. According to another exemplary embodiment, the first to third light-emitting devices may include a nano-LED. The nano-LED is a kind of LED and may have a size of several nanometers to tens of nanometers. A pixel of the display apparatus may include one nano-LED or a plurality of nano-LEDs having smaller sizes.

In addition, in the display apparatus according to the above exemplary embodiments and modified examples thereof, the upper substrate 400 may include an opaque material, i.e., the upper substrate 400 may be opaque. For example, the upper substrate 400 may include a black pigment such as carbon black or an opaque material. This may be implemented when the material for forming the upper substrate 400 applied onto the carrier substrate 10 includes the black pigment or the opaque material. Alternatively, when the material for forming the upper substrate 400 is applied to form a layer, the layer may include particles including black or opaque material. In this case, the upper substrate 400 may function as a black matrix, and thus, various effects such as preventing the visibility of displayed images from degrading due to the external light may be obtained.

According to principles and one or more exemplary embodiments of the invention, the display apparatus may have a low defect ratio during the manufacturing processes and consume less amount of material. However, the exemplary embodiments are not limited to the above effects.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a first substrate;
   a first light-emitting device, a second light-emitting device, and a third light-emitting device disposed over the first substrate, each of the first to third light-emitting devices including a first light emission layer;
   a second substrate disposed over the first substrate with the first to third light-emitting devices therebetween, the second substrate including a first through hole, a second through hole, and a third through hole overlapping the first to third light-emitting devices;
   a reflective layer on an inner surface of each of the first to third through holes;
   a first color filter layer in the first through hole;
   a second color filter layer and a second quantum dot layer in the second through hole;
   a third color filter layer and a third quantum dot layer in the third through hole;
   a first protective layer between the second color filter layer and the second quantum dot layer and between the third color filter layer and the third quantum dot layer;
   a second protective layer disposed between the second quantum dot layer and the second light-emitting device and between the third quantum dot layer and the third light-emitting device,
   wherein the second protective layer is in contact with the first protective layer on a portion of a lower surface of the second substrate outside the first to third through holes, the lower surface facing the first substrate.

2. The display apparatus of claim 1, wherein the first to third light-emitting devices comprise:
   a first pixel electrode, a second pixel electrode, and a third pixel electrode; and
   an opposite electrode overlapping the first to third pixel electrodes,
   wherein the first light emission layer is disposed over the first to third pixel electrodes and interposed between the first to third pixel electrodes and the opposite electrode.

3. The display apparatus of claim 1, wherein the first light emission layer is configured to emit light in a first wavelength band, the second quantum dot layer is configured to convert the light in the first wavelength band into light in a second wavelength band, and the third quantum dot layer is configured to convert the light in the first wavelength band into light in a third wavelength band.

4. The display apparatus of claim 1, wherein the reflective layer covers a portion of the lower surface of the second substrate outside the first to third through holes.

5. The display apparatus of claim 1, wherein the second quantum dot layer is between the second color filter layer and the second light-emitting device, and the third quantum dot layer is between the third color filter layer and the third light-emitting device.

6. The display apparatus of claim 5, wherein the first substrate is a lower substrate, the second substrate is an upper substrate, and an upper surface of the first color filter layer, an upper surface of the second color filter layer, and an upper surface of the third color filter layer, form a substantially continuous surface with an upper surface of the upper substrate, the upper surface of the upper substrate being opposite to the lower substrate.

7. The display apparatus of claim 1, wherein the first protective layer is integrally formed as a single body over substantially an entire surface of the second substrate.

8. The display apparatus of claim 1, further comprising a light transmission layer in the first through hole interposed between the first color filter layer and the first light-emitting device.

9. The display apparatus of claim 8, wherein the first protective layer is between the first color filter layer and the light transmission layer.

10. The display apparatus of claim 1, wherein the second protective layer is integrally formed as a single body over substantially an entire surface of the second substrate.

11. The display apparatus of claim 1, wherein the inner surface of each of the first to third through holes is inclined with respect to the lower surface of the second substrate.

12. The display apparatus of claim 1, wherein a first cross-sectional area of each of the first to third through holes taken along a first plane substantially parallel to the lower surface of the second substrate is smaller than a second cross-sectional area of each of the first to third through holes taken along a second plane substantially parallel to the lower surface of the second substrate, the second plane being closer to the first substrate than the first plane.

13. The display apparatus of claim 1, wherein the second substrate includes an opaque material.

14. The display apparatus of claim 1, wherein the second substrate comprises a black pigment.

15. The display apparatus of claim 1, wherein the second substrate is opaque.

16. A method of manufacturing a display apparatus, the method comprising the steps:

forming a layer of a first substrate on a carrier substrate;

forming the first substrate by forming a first through hole, a second through hole, and a third through hole in the layer of the first substrate;

forming a reflective layer on the first substrate;

removing the reflective layer on the carrier substrate in the first to third through holes;

forming a first color filter layer in the first through hole;

forming a second color filter layer in the second through hole;

forming a third color filter layer in the third through hole;

forming a first quantum dot layer on the second color filter layer in the second through hole;

forming a second quantum dot layer on the third color filter layer in the third through hole;

forming a first protective layer between the second color filter layer and the second quantum dot layer and between the third color filter layer and the third quantum dot layer;

forming a first light-emitting device, a second light-emitting device, and a third light-emitting device over a second substrate, the first to third light-emitting devices including a first light emission layer;

aligning and bonding the first substrate and the second substrate to each other with the first to third light-emitting devices therebetween, wherein the first to third through holes overlap the first to third light-emitting devices; and forming a second protective layer disposed between the second quantum dot layer and the second light-emitting device and between the third quantum dot layer and the third light-emitting device, such that the second protective layer is formed to be in contact with the first protective layer on a portion of a lower surface of the second substrate outside the first to third through holes, the lower surface facing the first substrate.

* * * * *